(12) United States Patent
Li et al.

(10) Patent No.: US 6,778,870 B1
(45) Date of Patent: Aug. 17, 2004

(54) DESIGN EVALUATION SYSTEM

(75) Inventors: Harry Li, Windsor (CA); Howard Edmund Scheer, West Bloomfield, MI (US); Jhun-Sou Lin, Novi, MI (US); Shao-Chiung Lu, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/482,455

(22) Filed: Jan. 13, 2000

(51) Int. Cl.[7] ............................................. G06F 19/06
(52) U.S. Cl. ....................... 700/97; 700/115; 705/400
(58) Field of Search .................... 700/97, 103, 106, 700/108, 109, 110, 115, 107; 705/28, 8, 29, 400

(56) References Cited

U.S. PATENT DOCUMENTS 5,671,338 A * 9/1997 Araki et al. ................... 706/46
5,681,145 A * 10/1997 Neely et al. ................. 415/119

* cited by examiner

*Primary Examiner*—Leo Picard
*Assistant Examiner*—Kidest Bahta
(74) *Attorney, Agent, or Firm*—Brinks Hofer Gilson & Lione

(57) ABSTRACT

A design evaluation system 10 which evaluates a design 44 of a component or assembly, such as component or assembly 12. Particularly, system 10 includes a database 30 having several equality and inequality relationships which are required to be satisfied by the design 44. System 10 also includes several equality and inequality relationships which system 10 attempts to have satisfied by the design 44, but which are not required to be satisfied. System 10 further dynamically modifies the values of certain variables within the design 44 in order to substantially ensure that the design 44 is modified in a manner which is consistent with certain of the equality and inequality relationships which are contained within the database 30.

20 Claims, 5 Drawing Sheets

| Hard Equations | Hard Rules |
|---|---|
| IDia2 = 0.95*IDia3 | IDia3 > IDia2 > IDia1 >= IDia4 |
| ODia1 = ODia3 - 17.3 mm | TDia8 <= TDia2 |
| ODia3 = IDia3 + 2*8.65 mm + 1 mm | MDia3 > ODia2 > MDia2 |
| OHt3 = IHt2 + 106 mm | ODia1 < FDia1 |
| TDia7 = ODia3 - 1mm | ODia3 > FDia1 |
|  | MDia5 < IDia3 |
|  | FDia1 > TDia2 |

| Soft Equations | Soft Rules |
|---|---|
| TRads1 = ( 1/4 )*TDia5 | FHt1 >= 3/4 inches |
| FDia2 = IDia1 + 1mm | 8.5 mm <= IHt1 <= 25 mm |
|  | TDia3 < TDia8 |
|  | 25 mm <= OHt1 |
|  | ODia1 > TDia2 > IDia2 |
|  | TL4 >= FL1 |

Figure 4

DESIGN EVALUATION SYSTEM

FIELD OF THE INVENTION

This invention relates to a design evaluation system and more particularly, to a computerized design evaluation system which selectively evaluates certain proposed component and assembly designs by the use of certain information which has been acquired from a variety of sources and individuals and/or experts having a respectively high degree of knowledge in the design and development of these respective components and assemblies.

BACKGROUND OF THE INVENTION

Computerized design systems, commonly referred to as "computer aided design systems" or "CAD systems", generally allow many diverse types of components and assemblies, such as vehicular components and assemblies, to be efficiently designed and developed. Particularly, these systems include at least one computer terminal or display device which is operable under stored program control and which selectively allows a user to view and modify the component and/or assembly which is to be designed and developed. That is, the shape and geometric configuration of the component or assembly is displayed to the user and is allowed to be dynamically and pictorially modified, thereby allowing the user and/or designer to dynamically create a useful and desirable overall design. Typically, the user is given "complete control" of the design process, thereby allowing the user to specify and modify each and every design value and/or parameter which is required to design and/or develop the component and/or assembly. Oftentimes the designer employs rules and/or guidelines which the designer has learned from the designer's own personal experience or rules and/or guidelines which have been "handed down" or developed on an "ad-hoc" basis.

While these computerized design systems do allow for the design and development of various diverse types of components and assemblies, they do not generally ensure that proper design criteria or rules are adhered to by the designer and oftentimes increase the complexity and inefficiency of the overall design process by failing to note or warn the designer, especially a relatively inexperienced designer, of an error in the design or a violation of a certain design principle or guideline, thereby requiring the designer or user to create multiple iterations of the design in order to ensure the creation of a viable design.

Further, these computerized design and development systems do not typically "capture" or include the various design rules and/or guidelines which are typically used by designers of a particular component or assembly, thereby preventing the user from gaining access to this valuable body of expert knowledge. This knowledge is particularly important to "new", relatively young, and/or relatively inexperienced designers who would greatly benefit from access to this body of expert knowledge. This drawback is all the more acute when one considers the great need for such designers which exists today and the concomitant great need to train such new design personnel.

There is therefore a need for a computerized design evaluation system which automatically reviews a proposed design of a component and/or assembly by use of contained guidelines, rules, and other information which is obtained from expert sources and which automatically provides the result of such a comparison and review to a user of the system. There is a further need for a computerized design evaluation system which automatically modifies and/or changes certain design parameters or variables based upon changes made to other design parameters or variables, effective to allow the overall design to properly adhere to certain design guidelines or rules.

SUMMARY OF THE INVENTION

It is a first object of the present invention to provide a computerized design evaluation system which may be used in combination with a computer aided design system and which addresses and which overcomes some or all of the previously delineated drawbacks of prior computerized design and development systems.

It is a second object of the present invention to provide a computerized design evaluation system which automatically reviews a design of a component and/or assembly by use of certain information previously obtained from expert sources.

It is a third object of the present invention to provide a computerized design evaluation system which allows errors within the design of a component or assembly to be relatively quickly and easily modified and corrected by the use of a certain first group of required equality relationships and by the use of a certain second group of required inequality relationships.

According to a first aspect of the present invention, a system is provided for use in combination with a certain design of a component. The system includes a first portion which contains certain required equality relationships; a second portion which contains certain required inequality relationships; and a processor which receives the design and which evaluates the design by use of the certain required equality relationships and the certain required inequality relationships.

According to a second aspect of the present invention a method is provided for automatically identifying and correcting errors within a certain design of an assembly. The method includes the steps of creating a database of expert design guidelines; obtaining the design; and automatically comparing the design with the created database of expert information, effective to identify certain errors; modifying a first portion of the design, effective to correct the errors; and automatically modifying a second portion of the design in accordance with the modified first portion of the design.

These and other features, advantages, and aspects of the present invention will become apparent from a reading of the following detailed description of the preferred embodiment of the invention and by reference to the following drawings.

BRIEF DESCRIPTION OF THE DRAWINGS

FIG. 4 is a series of tables which include the expert information and/or guidelines which are used by the computerized expert design evaluation system which is shown in FIG. 1.

DETAILED DESCRIPTION OF THE PREFERRED EMBODIMENT OF THE INVENTION

Figure 1:
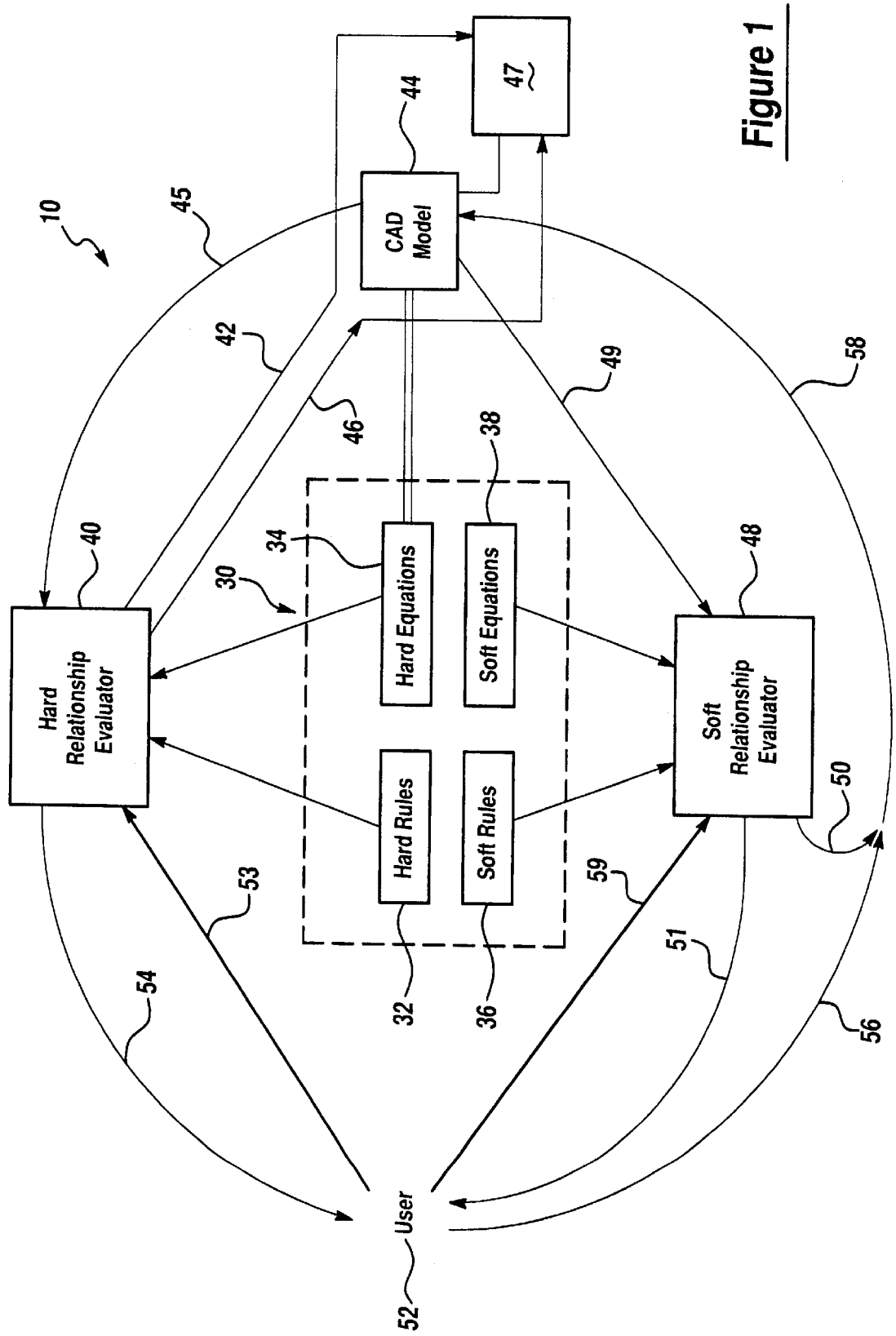
FIG. 1 is an operational flow diagram of the design evaluation system which is made in accordance with the teachings of the preferred embodiment of the invention.

Referring now to FIG. 1, there is shown an expert design evaluation system 10 which is made in accordance with the teachings of the preferred embodiment of the invention and which is adapted to evaluate a design of a component and/or assembly such as and without limitation, a vehicular air induction assembly 12 which may have been created by use of a typical or conventional computer aided design system 47. That is, while the use of expert design system 10 with a vehicular air induction assembly 12 is described more fully below, it should be realized that the expert design system 10 may be used to evaluate and review other diverse types of vehicular and non-vehicular assemblies, components, and elements. It should further be realized that in one non-limiting embodiment of the invention, system 10 may be created by and/or constitute or comprise software which resides within the computer aided design system, such as system 47, which has produced the designs or models, such as design 44 representing the vehicular air induction assembly 12.

Alternatively, the system 10 may operatively reside upon a separate and unique computer platform or processor which is communicatively coupled to the computer aided design system which created the model or design 44. In this manner, the design or model 44 is communicated to the system 10 and the necessary modifications, corrections, or suggested changes are communicated to the remotely placed computer aided design system 47. In order to more fully understand the operation of the system 10, the following discussion will delineate the various aspects of one type of selectively designed vehicular assembly 12 to which system 10 may be applied.

Figure 2:
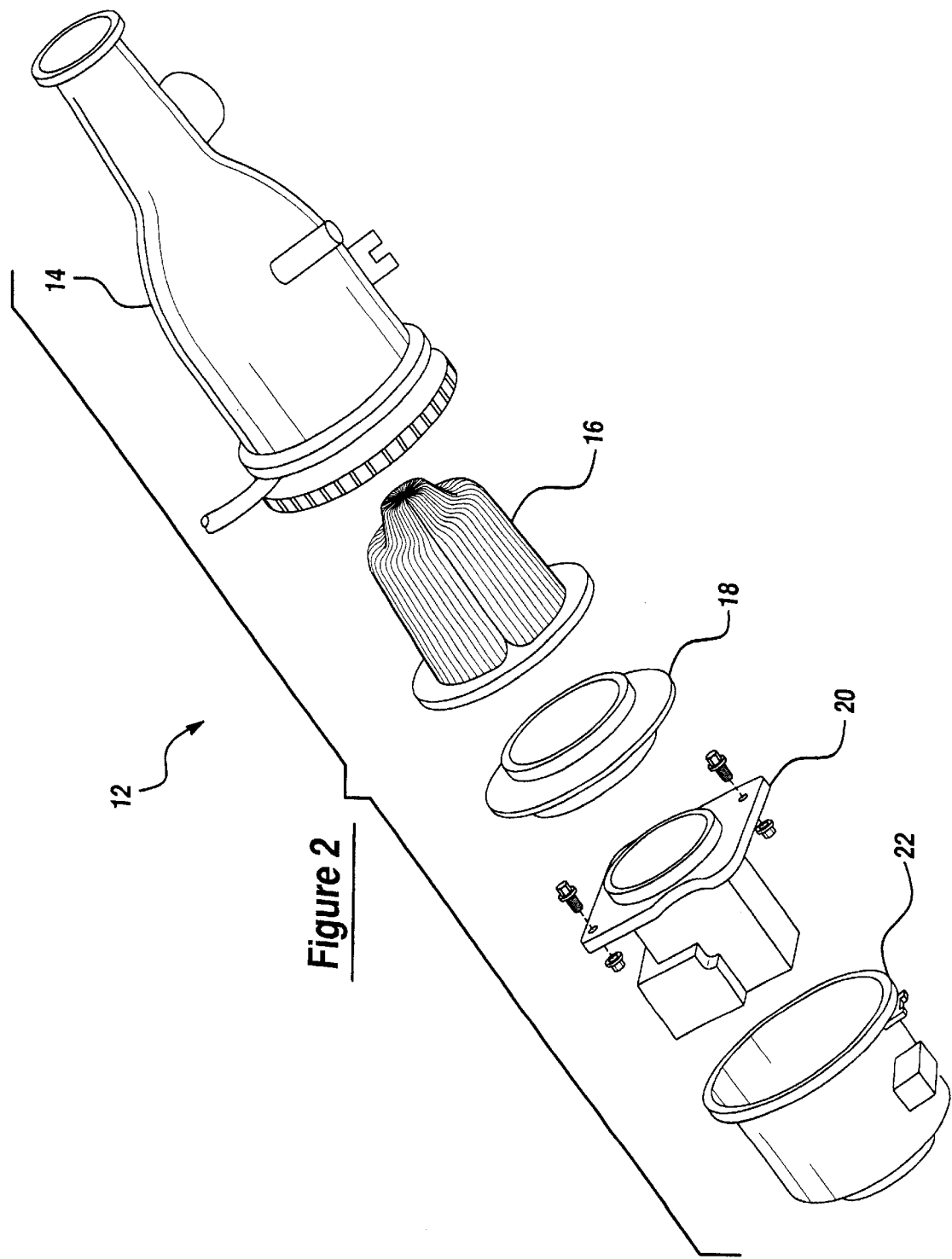
FIG. 2 is a perspective unassembled view of a vehicular air induction assembly which may be designed in accordance with the teachings of the preferred embodiment of the invention.
Figure 3:
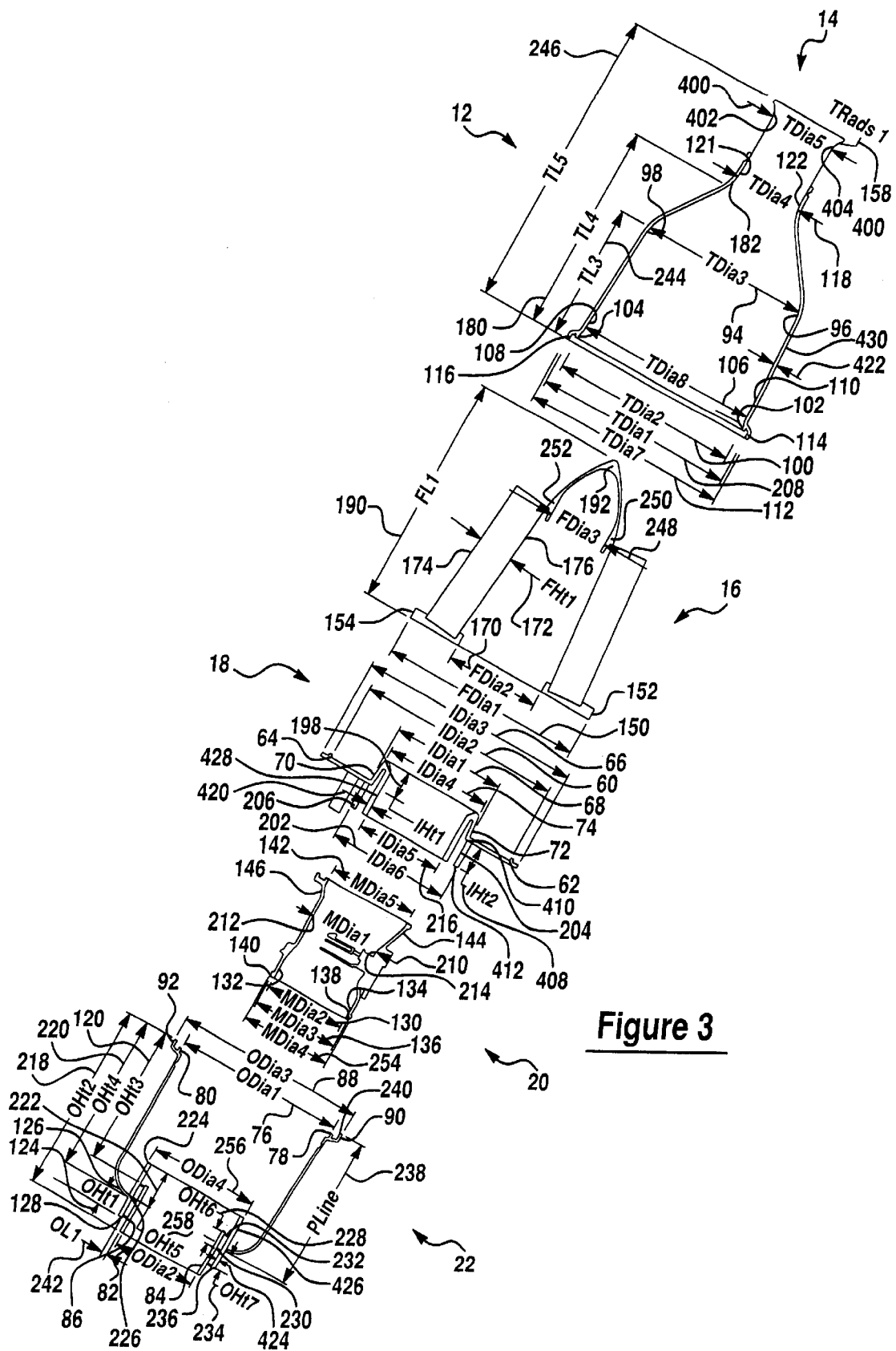
FIG. 3 is a schematic representation of the vehicular air induction assembly which is shown in FIG. 2.

As shown best in FIGS. 2 and 3, vehicular air induction assembly 12 comprises a tray member 14, an air filter 16 which is selectively and operatively received within the tray member 14, and an inner cover member 18 which selectively overlays and abuts the air filter 16 when the air filter 16 is selectively and operatively placed within the tray member 14. Further, assembly 12 includes a conventional mass air flow sensor or "MAFS" member 20 which receives the inner cover member 18 and an outer cover member 22 which is adapted to be removably secured to the tray member 14 and to securely retain members 16, 18, and 20 within the tray member 14. While the functionality of each of the portions 14, 16, 18, 20, and 22 are known and conventional and while the functionality and operation of the assembly 12 is known and conventional, the overall geometric configuration (i.e., the size and shape) of each of the portions 14, 16, 18, 20, and 22 are not fixed, but are dynamically adjustable or "designable" based upon the various types of vehicles and mounting space which is provided for a particular designed assembly 12. Hence, the design of the assembly 12 requires that the various sizes, shapes, and tolerances of each of the members 14, 16, 18, 20, and 22 be operatively specified and allow for each of the members or portions 14, 16, 18, 20, and 22 to be operatively assembled to form assembly 12 in the foregoing manner and to be capable of being operably received within a particular type of vehicle and mounting space. It is this type of design which is to be evaluated by the design evaluation system 10 of the preferred embodiment of the invention, although other types of designs may be evaluated by other non-limiting embodiments of system 10.

In order to properly evaluate a design of the assembly 12, according to the preferred embodiment of the invention, an expert design database 30 is created and contains certain guidelines or information which are compiled and used by experienced or expert vehicular air intake assembly designers.

Particularly, database 30, as shown best in FIG. 1, includes design information which has been obtained from a variety of sources or experts in the area of the design of vehicular air induction systems. Particularly, database 30 includes a first database portion 32 having "hard design rules" which represent inequalities which must each be or are required to be satisfied by the proposed design 44. Database 30 further includes a second database portion 34 having "hard equations" which represent equalities which must each be satisfied by and are each required to be satisfied by the proposed design 44, and a third database portion 36 having "soft design rules" which represent inequalities which should be or are recommended to be satisfied by the proposed design 44, but are not necessarily required to be satisfied by the proposed design 44. Lastly, database 30 represents a fourth database portion 38 having "soft equations" which represent equalities which should be or are recommended to be satisfied by the proposed design 44, but are not necessarily required to be satisfied by the proposed design 44. In one non-limiting embodiment, portions 32, 34, 36, 38 of database 30 and portions 40, 48 may be wholly contained implemented in software and made to be resident within system 47, within a separate processor, and/or may cooperatively form and/or comprise a processor or controller.

It should be noted that the use of both hard inequalities and hard equalities allows the design 44 to be evaluated in a substantially complete manner since an evaluation which only determines whether certain equality conditions are met will not allow the designer the flexibility to proportionally change the geometric configuration of certain portions of the assembly 12. For example and without limitation, the portion of the filter element 16 which is to be received into the filter tray reception portion of the tray member 14 and the filter element reception portion of the tray member 14 may each be made relatively and respectively smaller as long as the filter element or member 16 is concomitantly allowed to be operatively received by the tray member 14. The respective geometric configurations of the filter element 16 and the tray member 14 may therefore proportionally change (i.e., the relative size of members 14 and 16 remain substantially constant).

The use of soft rules and equations further allows the design to be selectively optimized in a manner which will not prevent the proposed design 44 from being utilized if the optimization cannot fully be accomplished. Hence, the system 10 allows for and/or provides the flexibility to potentially optimize the design 44 while concomitantly preventing an otherwise viable design 44 from being discarded.

System 10 further includes a "hard relationship evaluation" portion 40 which receives the proposed assembly or component design 44, as shown by arrow 45, and which reviews the proposed design 44 and determines whether each of the required hard design rules and hard equations are satisfied by the proposed design 44. If each and every hard design rule and hard equation are not satisfied by the proposed design, system 10 generates a signal, shown by arrow 42, to the design system or modeling system 47 which produced the proposed design 44, thereby notifying system 47 of this difficulty. If each of the hard equations and the hard design rules are satisfied by the proposed design, portion 40 transmits a signal, shown by arrow 46, to the modeling system 47, allowing the evaluated design to be utilized.

System 10 further includes a soft relationship evaluator 48 which also receives the design or model 44, shown by arrow 49. In operation, the soft relationship evaluator 48 makes certain recommendations by applying the soft equations portion 38 of the database 30 and the soft rules portion 36 of the database 30 to the model or design 44. This evaluation may be accomplished upon a request by a user or designer 52, as shown by arrow 59. Alternatively, this evaluation may automatically be accomplished by the system 10. Based upon the evaluation, the soft relationship evaluator 48 generates suggested changes, comments, or recommendations concerning these suggested changes or design modifications to the system 47, as shown by arrow 50, and may provide an indication to the designer or user, as shown by arrow 51, of whether the design or model 44 met the soft design rules or equations.

Moreover, as further shown best in FIG. 1, the user or designer 52 may request that certain changes be made to the model or design 44. In one non-limiting embodiment, the hard relationship evaluator may be resident within the system 47 and, as such, may receive these requests, shown by arrow 53, as the user 52 creates these requests within the system 47. The hard relationship evaluator 40 then compares the requested changes to the hard equation portion 34 and the hard design rules portion 32 of the database 30 and, as shown by arrow 54, selectively rejects these proposed changes if the changes cause the model or design 44 to violate at least one of the hard equations or hard design rules. Alternatively, the hard relationship evaluator 40 allows these proposed or requested changes to be made by the system 47. Further, in yet another non-limiting embodiment, the user 52 may be allowed to accept the changes suggested by the soft relationship evaluator 48, shown by arrow 56, before these optimization changes are made to the model 44, in the manner shown by arrow 58.

The hard and soft equations and rules, which are used within system 10, are set forth in FIG. 4 and may be better understood by the schematic diagram of a vehicular air induction system or assembly 12, which is shown in FIG. 3.

Various terms are used which allow a more full comprehension of the system 10 and these terms represent variable which are selectively adapted to assume one of several desired values by use of the design system 47. That is, the term "IDia2" refers to the length 60 between orifices 62, 64 of the inner cover element 18; the term "IDia3" refers to the length 66 of the base portion of the inner cover element 18; the term "IDia1" refers to the length 68 between the respective outside surfaces of protrusions 70, 72 of the inner cover element 18; and the term "IDia4" represents the length 74 between the respective top portions of the protrusions 70, 72.

Additional terms may further allow for a more complete understanding of system 10. The term "ODia1" represents the length 76 between protrusions 78 and 80 of the outer cover member 22; the term "ODia2" represents the length 82 between surfaces 84, 86 of the outer cover member 22; and the term "ODia3" represents the length 88 between protrusions 90, 92 of the outer cover member 22. The term "TDia3" refers to the length 94 between surface portions 96, 98 of the tray member 14 and the term "TDia2" refers to the length 100 between protrusions 102, 104 of the tray member 14. The term "TDia8" refers to the length 106 between surfaces 108, 110 of the tray member 14, the term "TDia7" refers to the length 112 between protrusions 114, 116 of the tray member 14, and the term "TDia4" refers to the length 118 between surface portions 121, 122 of the tray member 14. The term "OHt3" refers to the length 120 between the top surface of the portion 86 and the top surface of the portion 92 of the outer cover member 22 and the term "OHt1" refers to the distance 124 between portions 126 and 128 of the outer cover member 22.

Furthermore, yet more terms may be required for a more thorough understanding of the system 10. The term "MDia2" refers to the distance 130 between portions 132 and 134 of the "MAFS" member 20, the term "MDia3" refers to the distance 136 between portions 138 and 140 of the member 20, and the term "MDia5" refers to the distance 142 between portions 144 and 146 of the member 20. The term "FDia1" refers to the distance 150 between the outermost edges of protrusions or flanges 152, 154 of the filter element 16 and the term "TRads1" refers to the value of the angle 158 which is formed by the tray member 14. The term "FDia2" refers to the distance 170 between the respective inner portions of the protrusions or flanges 152, 154, and the term "FHt1" refers to the distance 172 between portions 174 and 176 of the filter element 16. The term "TL4" refers to the distance 180 between the outermost edge of portion 116 and portion 182 of the tray member 14. The term "FL1" refers to the distance 190 between the tip portion 192 and the outermost edge of portion 154 of the filter member 16. The term "IHt1" refers to the distance 198 along portion 70 of the inner cover member 18.

Hence, the entries in the following tables 1, 2, 3, and 4 respectively represent the entries and/or the guidelines and/or the information which is, in one non-limiting embodiment, contained within databases 34, 32, 38, and 36.

TABLE 1

Hard Equations - Portion 34 of Database 30†

$IDia2 = 0.95 \ast IDia3$
$ODia1 = Odia3 - 17.3 \text{ mm}$
$ODia3 = Idia3 + 2 \ast 8.65 \text{ mm} + 1 \text{ mm}$
$OHt3 = IHt2 + 106 \text{ mm}$
$TDia7 = Odia3 - 1 \text{ mm}$

TABLE 2

Hard Rules - Portion 32 of Database 30†

$IDia3 > IDia2 > IDia1 >= IDia4$
$TDia8 <= TDia2$
$MDia3 > ODia2 > MDia2$
$ODia1 < FDia1$
$ODia3 > FDia1$
$MDia5 < IDia3$
$FDia1 > TDia2$

TABLE 3

Soft Equations - Portion 38 of Database 30†

$TRads1 = (1/4) \ast TDia5$
$FDia2 = IDia1 + 1 \text{ mm}$

TABLE 4

Soft Rules - Portion 36 of Database 30†

$FHt1 >= 3/4 \text{ inches}$
$8.5 \text{ mm} <= IHt1 <= 25 \text{ mm}$
$Tdia3 < Tdia8$
$25 \text{ mm} <= Oht1$ TABLE 4-continued Soft Rules - Portion 36 of Database 30†

ODia1 > Tdia2 > IDia2
TL4 >= FL1

†Please note that the term "mm", as used within the above tables 1–4, refers to "millimeters"; the symbol "*" refers to multiplication; the symbol "/" refers to division; the symbol ">" means "greater than"; the symbol "<" means "less than"; the symbol "<=" means "less than or equal to"; and the symbol ">=" means "greater than or equal to".

To understand the structural interrelationships between the variables of the design 44, additional variables must be defined. That is, the term "IDia6" refers to the distance 202 of flange elements 204, 206 of the inner cover member 18 and the term "TDia1" refers to the distance 208 between the inner edges of portions 114, 116 of the tray member 14. The term "MDia1" refers to the distance 210 between surface portions 212 and 214 of the "MAFS" member 20 and the term "IDia5" refers to the distance 216 between portions 70 and 72 of inner cover member 18. The term "OHt2" refers to the distance 218 which represents the overall length or the height of the outer cover member 22 and the term "OHt4" represents the distance 220 between portions 92 and 126. The term "OHt5" represents the distance 222 between portions 224 and 226 of the member 22 and the term "OHt6" represents the distance 228 between portions 230 and 232 of the member 22. The term "OHt7" represents the distance 234 between portion 230 and portion 236 of the member 22.

Additionally, the term "PLine" represents the distance 238 between portions 230 and 240 of the member 22 and the term "OL1" represents the distance 242 between portions 86 and 128 of the member 22. The term "TL3" represents the distance 244 between portion 182 and the outermost edge of portion 116 and the term "TL5" represents the overall length or height 246 of the tray member 14. The term "FDia3" represents the distance 248 between the flanges 250, 252 of the filter member 16 and the term "MDia4" represents the distance 254 between the respective and outermost edges of the flange members or portions 132, 134. The term "ODia4" represents the distance 256 between members or portions 224 and 236 and defining the diameter of the "MAFS" reception cavity 258. The term "TDia5" represents the distance 400 between portions 402 and 404 of the tray member 14 and the term "IHt2" refers to the distance 408 from end 410 to end 412 of portion 204 of member 18. The term "TTH" represents the substantially uniform thickness 422 of wall portion 430 of tray member 14. The term "ITH" represents the substantially uniform thickness 420 of wall portion 428 of inner cover member 18. The term "OTH" represents the substantially uniform thickness 424 of wall portion 426 of outer cover member 22. It should be appreciated that other types or amounts of variables, equalities, and/or inequalities may be selectively specified and used within system 10 and that in other embodiments, different variables which define different structural relationships may be used to evaluate the particular design.

Figure 5:
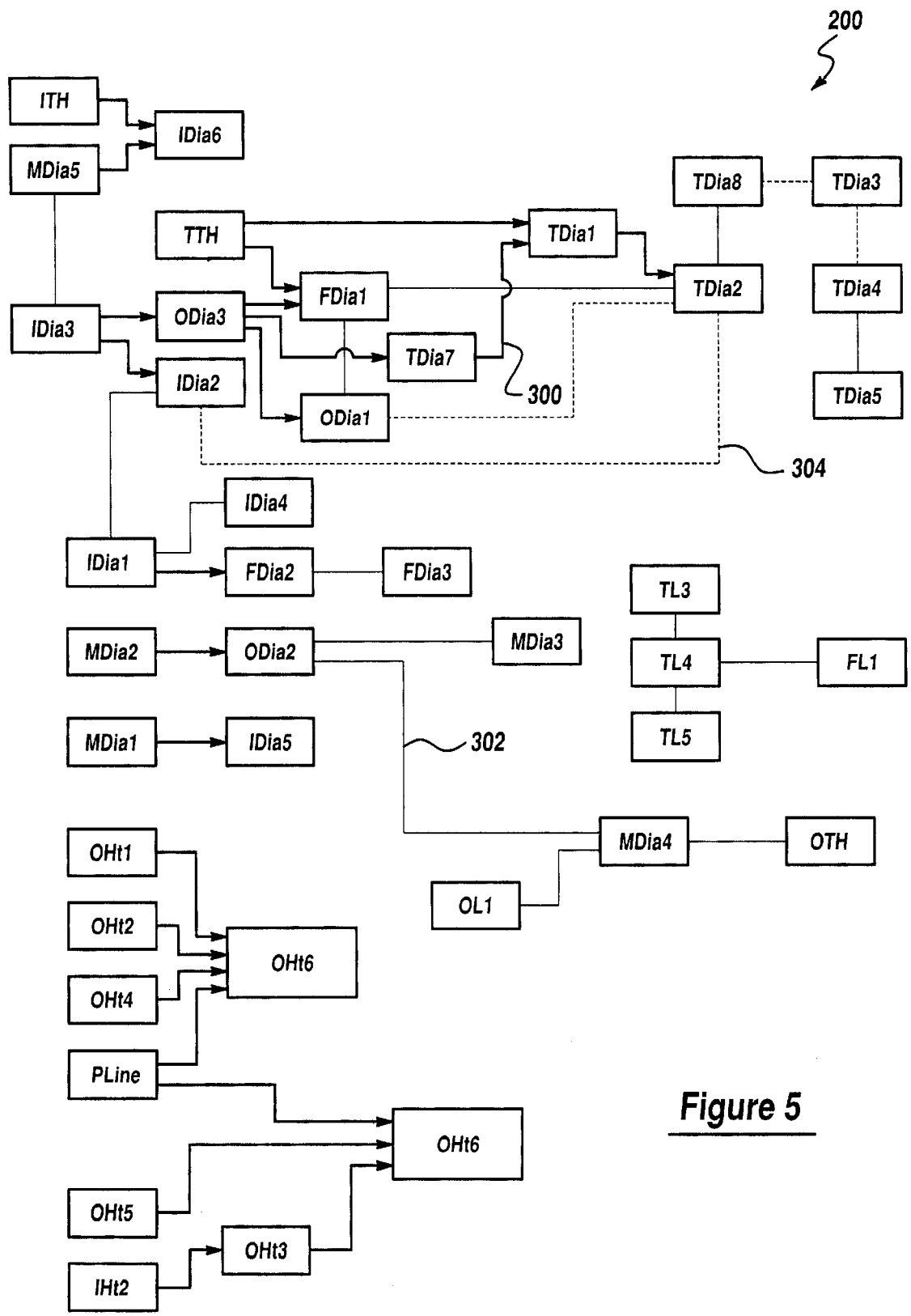
FIG. 5 is a flow chart illustrating the interrelationships of various portions of the expert information and/or guidelines which are shown in FIG. 4.

To more fully understand the interrelationships of these variables, reference is now made to the operational flow diagram 200 which is set forth in FIG. 5. As shown in the operational diagram 200, a change in the respective values of some of these variables, such as "IDia1", automatically cause the value of other variables, such as "FDia2", to change in order to ensure that the hard equations are substantially always satisfied. That is, variables, such as "IDia1" and "FDia2"; and "TDia7" and "TDia1" which are respectively related and joined by a solid arrow, such as arrow 300 have this relationship. The "driving variable" (i.e., the variable which causes the other variable to change), such as "IDia1" is placed to the left of or comprises the "source of" the respective arrow, such as arrow 300. Variable which are connected by solid non-directional lines, such as line 302, are sequentially evaluated (e.g., in the order they appear on diagram 200 from "left to right") to determine whether certain hard rules are met. Variables which are connected by broken non-directional lines, such as line 304, are sequentially evaluated (e.g., in the order they appear on diagram 200 from "left to right") to determine whether the soft equations and soft rules are met or satisfied.

In this manner, system 10 dynamically updates or changes the previously delineated variables or variable values in accordance with a change which may be made to a single variable or value, thereby allowing the modified model or design 44 to be in compliance with the various "hard" equations and rules, even though only one variable is modified. System 10 also automatically evaluates the proposed design to allow for desired optimization. System 10 also dynamically evaluates and appropriately configures and appropriately modifies each of the previously delineated variables after any change is made or contemplated to the design or model 44. In another non-limiting embodiment, system 10 evaluates the design 44 and automatically corrects errors or mistakes in the design 44 by automatically changing the values of some or all of the variables, such as those which have been previously delineated, in order to ensure that the newly and automatically modified design complies with the previously delineated hard equations and inequalities.

It is to be understood that the invention is not limited to the exact construction or method which has been previously delineated, but that various changes and modifications may be made without departing from the spirit and the scope of the invention as are more fully delineated in the following claims.

What is claimed is:

1. A multi-dimensional design evaluation system for use in combination with a design of a multi-dimensional automotive component, said multi-dimensional design evaluation system comprising:

a first portion which contains certain equality relationships;

a second portion which contains certain inequality relationships; and a third portion which receives said multi-dimensional design of said multi-dimensional automotive component and which evaluates said multi-dimensional design by use of said certain equality relationships and said certain inequality relationships.

2. The multi-dimensional design evaluation system of claim 1 wherein said multi-dimensional automotive component comprises a vehicular air induction assembly.

3. The multi-dimensional design evaluation system of claim 1 wherein said third portion ensures that each of said equality and inequality relationships are satisfied by said multi-dimensional design.

4. The multi-dimensional design evaluation system of claim 3 further comprising a fourth portion which contains certain recommended equality relationships which are used by said third portion to further evaluate said multi-dimensional design.

5. The multi-dimensional design evaluation system of claim 4 further comprising a fifth portion which contains certain recommended inequality relationships which are used by said third portion to further evaluate said multi-dimensional design.

6. The multi-dimensional design evaluation system of claim 3 wherein said third portion only allows said multi-dimensional design to be modified when said modified multi-dimensional design satisfies each of said equality and inequality relationships.

7. An apparatus for use in combination with a computer aided multi-dimensional design system of the type which selectively produces a multi-dimensional design of multi-dimensional assembly having a plurality of variables which are equal to certain respective values, said apparatus comprising:

a first evaluation portion which includes an equality relationship between a first and a second of said plurality of variables;

a second evaluation portion which includes an inequality relationship between a third and a fourth of said plurality of variables; and a third portion which uses the first and second portion to determine whether said respective values of said first and second variables of said multi-dimensional design satisfy said equality relationship and whether said respective values of said third and fourth variables satisfy said inequality relationship.

8. The apparatus of claim 7 wherein said third portion generates a signal when said equality and inequality relationships are satisfied.

9. The apparatus of claim 7 wherein said third portion substantially prevents modifications to said multi-dimensional design which cause said equality relationships to be violated.

10. The apparatus of claim 9 wherein said third portion automatically modifies the value of a fifth of said plurality of variables upon a change of said value of said third of said plurality of variables, effective to allow said equality relationships to be satisfied.

11. The apparatus of claim 9 wherein said assembly comprises a vehicular air induction assembly.

12. The apparatus of claim 10 wherein said vehicular air induction assembly comprises:

a tray member;

a filter element;

an inner cover member;

a mass air flow sensor member; and an outer cover member.

13. A method for evaluating a multi-dimensional design of a multi-dimensional assembly having a plurality of variables which are equal to certain respective values, said method comprising the steps of:

creating a database of expert design guidelines;

obtaining said multi-dimensional design of said multi-dimensional assembly;

providing a computer program having a first evaluation portion which includes an equality relationship between a first and a second of said plurality of said variables, a second evaluation portion which includes an inequality relationship between a third and a fourth of said plurality of said variables, and a third portion which uses said first and said second portions to determine whether said respective values of said first and said second variables of said design satisfy said equality relationship and determine whether said respective values of said third and said fourth variables satisfy said inequality relationship; and utilizing said computer program to automatically evaluate said multi-dimensional design with said created database of expert design guidelines.

14. The method of claim 13, wherein said step of providing computer program further comprises the steps of:

programming a signal to be generated by said third portion when said equality and said inequality relationships are satisfied; and generating said signal when said equality and said inequality relationships are satisfied.

15. The method of claim 14 further comprises the step of: programming said third portion to prevent any modifications to said design which cause said equality relationships to be violated.

16. The method of claim 13 wherein said step of providing computer program further comprises the steps of: providing a fourth portion which contains certain recommended equality relationships which are utilized by said third portion to further evaluate said design.

17. The method of claim 13 wherein said step of providing computer program further comprises the steps of: providing a fifth portion which contains certain recommended inequality relationships which are utilized by said third portion to further evaluate said design.

18. The method of claim 13 wherein said step of providing a computer program further comprises the step of: programming said third portion to automatically modify the value of a fifth of said plurality of variables upon a change of said value of said third of said plurality of variables.

19. The method of claim 18 wherein said step of programming said third portion to automatically modify the value of said fifth of said plurality of variables further comprises the step of:

programming said third portion to automatically modify said fifth of said plurality of variables with a value which allows said equality relationship to be satisfied.

20. The method of claim 13 wherein said step of providing a database of expert design guidelines further includes the steps of:

providing said database with a plurality of hard rules which each of said plurality respectively represents a respective inequality relationship;

providing said database with a plurality of hard equations which each of said plurality respectively represents a respective equality relationship;

providing said database with soft rules which each may be respectively violated by said design; and providing said database with soft equations which each may be respectively violated by said design.

* * * * *